United States Patent
Josefsson

(10) Patent No.: US 7,142,037 B2
(45) Date of Patent: Nov. 28, 2006

(54) SWITCHED CAPACITOR MUTUAL CHARGING SYSTEM AND METHOD

(75) Inventor: Olafur Mar Josefsson, North Reading, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/001,401

(22) Filed: Dec. 1, 2004

(65) Prior Publication Data

US 2006/0114049 A1    Jun. 1, 2006

(51) Int. Cl.
*G06F 7/64*    (2006.01)
*G06G 7/18*    (2006.01)

(52) U.S. Cl. ..................................... 327/337
(58) Field of Classification Search ............... 327/337, 327/554
See application file for complete search history.

(56) References Cited

U.S. PATENT DOCUMENTS

| 5,323,158 | A * | 6/1994 | Ferguson, Jr. ............... 341/143 |
| 5,392,043 | A * | 2/1995 | Ribner ........................ 341/143 |
| 6,617,908 | B1 * | 9/2003 | Thomsen et al. ............ 327/337 |
| 6,744,394 | B1 * | 6/2004 | Liu et al. ..................... 341/155 |
| 6,954,162 | B1 * | 10/2005 | Gupta ......................... 341/143 |

* cited by examiner

*Primary Examiner*—My-Trang Nu Ton
(74) *Attorney, Agent, or Firm*—Iandiorio & Teska

(57) ABSTRACT

A system and method for mutually charging switched capacitors in a switched capacitor system includes operating first and second sets of output switches during separate phases; operating first and second sets of input switches during separate phases but after the output switches are operated; and connecting the switched capacitors together after the output switches are operated but before the input switches are operated to enable them to share charge with each other toward a common mode voltage after the output switches are operated but before the input switches are operated.

15 Claims, 10 Drawing Sheets

SWITCHED CAPACITOR MUTUAL CHARGING SYSTEM AND METHOD

FIELD OF THE INVENTION

This invention relates to a switched capacitor mutual charging system and method in which the switched capacitors share charge with each other between switching phases.

BACKGROUND OF THE INVENTION

Switched capacitors need to be charged and discharged by low impedance circuitry, typically operational amplifiers. This circuitry represents loading on the operational amplifiers and has great bearing on the operational amplifier design and power consumption. In cross-coupled differential designs (most higher performance switched capacitor designs are differential) one typically sees a capacitor $C_1$ that in phase 1 needs to be charged from voltage $V_n$ to $V_p$. Correspondingly there is a capacitor $C_2$ that needs to be charged from $V_p$ to $V_n$ in phase 1. In phase 2 the reverse is true. $C_1$ is charged from $V_p$ to $V_n$ and $C_2$ from $V_n$ to $V_p$. $V_p$ and $V_n$ are symmetric around some common mode voltage $V_{cm}$, and typically the capacitance value of capacitor $C_1$ is the same as that of $C_2$. The operational amplifier driving $V_p$ and $V_n$ needs to supply all the charge needed to change the voltages on those capacitors from one voltage to another, i.e., a total charge of $C(V_p - V_n)$ on each capacitor.

BRIEF SUMMARY OF THE INVENTION

It is therefore an object of this invention to provide an improved switched capacitor system and method.

It is a further object of this invention to provide such an improved switched capacitor system and method which enables the switched capacitors to share charge with each other thereby removing part of the load for the driving circuit.

It is a further object of this invention to provide such an improved switched capacitor system and method which can reduce the power needed with little increase in added circuitry and area.

It is a further object of this invention to provide such an improved switched capacitor system and method which can reduce the total harmonic distortion.

The invention results from the realization that as one capacitor is being supplied charge, the other capacitor is being drained of charge. Therefore the capacitors can to some extent (about 50%) supply the needed charge to each other. To take advantage of this fact, the capacitors are shorted to each other while the output switches are closed so that their voltages meet at about $(V_p+V_n)/2$ (i.e. $V_{cm}$), then the operational amplifier supplies the remainder of the charge needed to move the capacitor voltages to their final values. As a result, the amplifier only needs to supply half the charge it did before. In other words, the loading on the amplifier has been cut in half which allows for power, size and performance improvements with very little additional hardware.

The subject invention, however, in other embodiments, need not achieve all these objectives and the claims hereof should not be limited to structures or methods capable of achieving these objectives.

This invention features a switched capacitor mutual charging system including a cross-coupled switched capacitor circuit having a cross-coupled input switch circuit and an output switch circuit. The output switch circuit has first and second sets of output switches selectively operated during separate phases. The cross-coupled input switch circuit includes first and second sets of input switches also selectively operated during separate phases, but delayed relative to that of the output switches. There are first and second capacitors connected between the output switch circuit and the cross-coupled input switch circuit. A shunt switching circuit connects together the capacitors after the output switches are operated but before the input switches are operated for enabling the capacitors to share charge with each other toward a common mode voltage after the output switches are operated but before the input switches are operated.

In a preferred embodiment, the shunt switching circuit may include a pass gate. There may be a clock system for generating the separate phases. The output switches may be connected cross-coupled. At least one of the sets of output switches may be connected to a common point. The shunt switching circuit may be between the capacitors and the cross-coupled input switch circuit.

The invention also features a method of mutually charging switched capacitors in a switched capacitor system. The method includes operating first and second sets of output switches during separate phases and operating first and second sets of input switches during separate phases but after the output switches are operated. The switched capacitors are connected together after the output switches are operated but before the input switches are operated to enable them to share charge with each other toward a common mode voltage after the output switches are operated but before the input switches are operated.

This invention also features a switched capacitor mutual charging system including a cross coupled switched capacitor circuit including a cross coupled input switch circuit and an output switch circuit. The output switch circuit has first and second sets of output switches operated during first and second phases. The cross coupled input switch circuit includes first and second sets of input switches operated during abbreviated first and second phases whose onsets are delayed relative to that of the first and second phases. There are first and second capacitors connected between the output switch circuit and the cross coupled input switch circuit. A shunt switching circuit connects together the capacitors during a shunt phase occurring between the onset of the first phase and abbreviated first phase and the second phase and the abbreviated second phase for enabling the capacitors to share charge with each other toward a common mode voltage after the onset of the first and second phases but before the onset of the abbreviated first and second phases.

In a preferred embodiment, the shunt switching circuit may include a pass gate; there may be a clock system for generating the first, second and shunt phases. The clock system may include a clock circuit for generating the first and second phases, an onset delay clock circuit responsive to the clock circuit for generating the abbreviated first and second phases, and a shunt phase clock circuit for generating the shunt phase between the onset of the first and second phases and the abbreviated first and second phases. At least one of the sets of output switches may be connected to a common point or they may be cross-coupled. The shunt switching circuit may be between the capacitors and the cross-coupled input switch circuit.

The invention also features a method of mutually charging switched capacitors in a switched capacitor system, including operating first and second sets of output switches during first and second phases and operating first and second sets of input switches during abbreviated first and second phases. The switched capacitors are connected together during a shunt phase between the onset of the first phase and abbreviated first phase and the second phase and abbreviated second phase to share charge with each other toward a common mode voltage after the onset of the first and second phases but before the onset of the abbreviated first and second phases.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
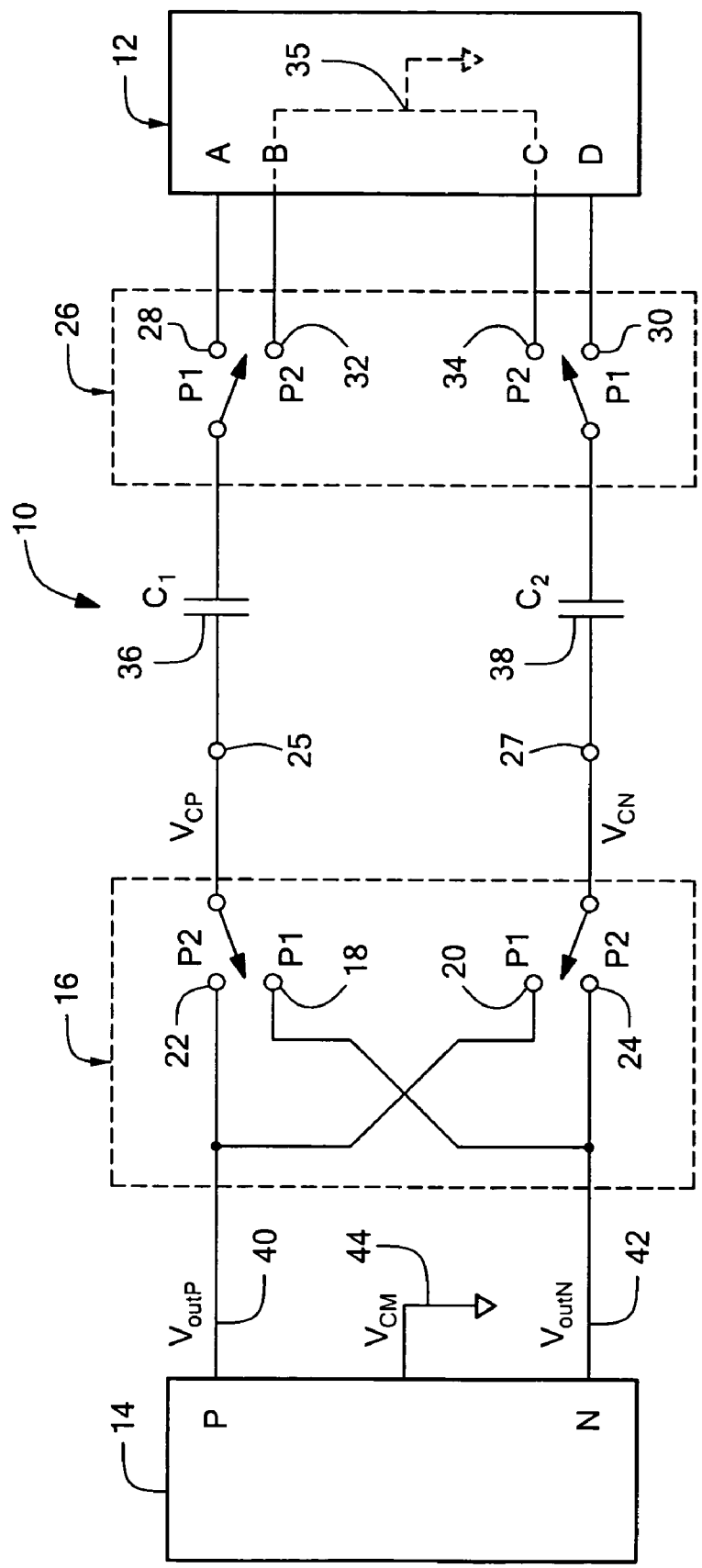
FIG. 1 is a schematic block diagram of a prior art switched capacitor circuit with driver and charge receiver circuits.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only 1 embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 a switched capacitor system 10 servicing a charge receiver 12, such as an integrator implemented with an operational amplifier, for example, and driven by a switched capacitor driver 14, such as an operational amplifier, or an ADC continuous time input circuit. Switched capacitor driver 14 provides outputs $V_{outp}$ and $V_{outn}$ at 40 and 42, respectively, where, for example, in this description, output $V_{outp}$ is higher than $V_{outn}$ and they are symmetrical about a common voltage $V_{cm}$ at 44. Switched capacitor system 10 includes a cross coupled input switch circuit 16 which includes a set of switches 18 and 20 and a second set of switches 22 and 24. In a first phase, P1, switches 18 and 20 are closed and switches 22 and 24 are open. In a second phase, P2, switches 22 and 24 are closed and switches 18 and 20 are open. Switched capacitor system 10 also includes an output switch circuit 26 which may or may not be cross coupled and includes a first set of switches 28 and 30 and a second set of switches 32 and 34 whose conditions respond to the first and second phases in a similar fashion to switches 18, 20, 22 and 24. Connected between cross-coupled input switch circuit 16 and output switch circuit 26 are switched capacitors 36, C1 and 38, C2. The inputs to switch circuit 16 from the P and N outputs of switched capacitor driver 14 are designated $V_{outp}$ and $V_{outn}$. A common mode voltage $V_{cm}$ is designated at 44. The voltages on nodes 25 and 27 of capacitors 36, C1 and 38, C2 are designated $V_{cp}$ and $V_{cn}$, respectively. Output switch 26 may be cross coupled or may have one of its sets of switches 32, 34 connected to a common point 35, as shown in phantom.

Figure 2:
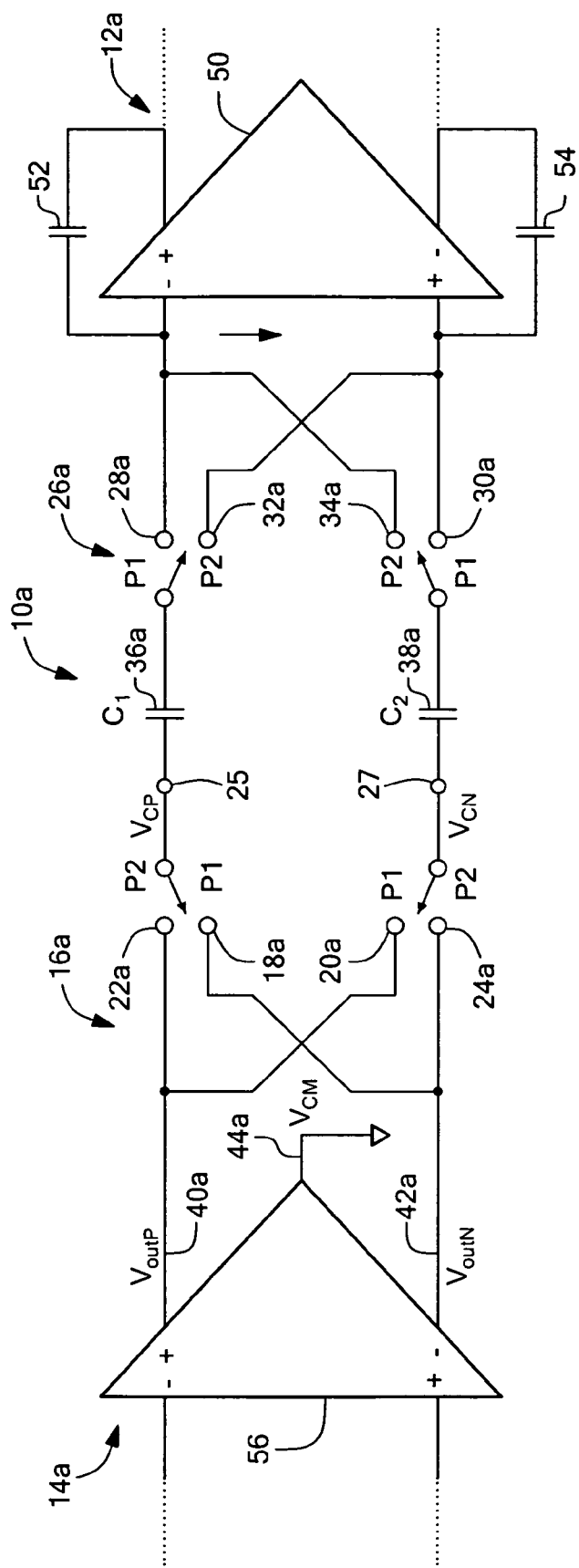
FIG. 2 is a view of a prior art switched capacitor circuit similar to FIG. 1 with cross-coupled input and output switched capacitors with an amplifier driver and integrator charge receiver circuit.

The operation of the this prior art device can be better understood with reference to FIG. 2 where charge receiver 12a has been depicted as an integrator including operational amplifier 50 and integrating capacitors 52 and 54 and switched capacitor driver 14a have been implemented as operational amplifier 56. Also in this case, output switch circuit 26a is implemented in a cross-coupled fashion similar to that of the cross-coupled input switch circuit 16a. In FIG. 2 and following, like parts have been given like numbers accompanied by lower case letters.

In operation, in phase P1, integrator capacitor 54 has charge sourced through switch 30a, switched capacitor 38a and switch 20a from the voltage $V_{outp}$ at 40a. Simultaneously, in phase P1 integrator capacitor 52 has charge sinked through switch 28a, switched capacitor 36a, and switch 18a from the voltage $V_{outn}$ at 42a. This assumes that $V_{outp} > V_{outn}$. While that is true in this example, it is not necessarily always the case: $V_{outn} > V_{outp}$ or vice versa. In phase P2 integrating capacitor 54 has charge sourced through switch 32a, switched capacitor 36a, and switch 22a from voltage $V_{outp}$ at 40a. Simultaneously, in phase P2 integrator capacitor 52 has charge sinked through switch 34a, switched capacitor 38a, and switch 24a to voltage $V_{outn}$ at 42a. In this way, integrator capacitor 52 has charge sinked in both phase P1 and phase P2 while integrator capacitor 54 has charge sourced in both phase P1 and phase P2.

Figure 3:
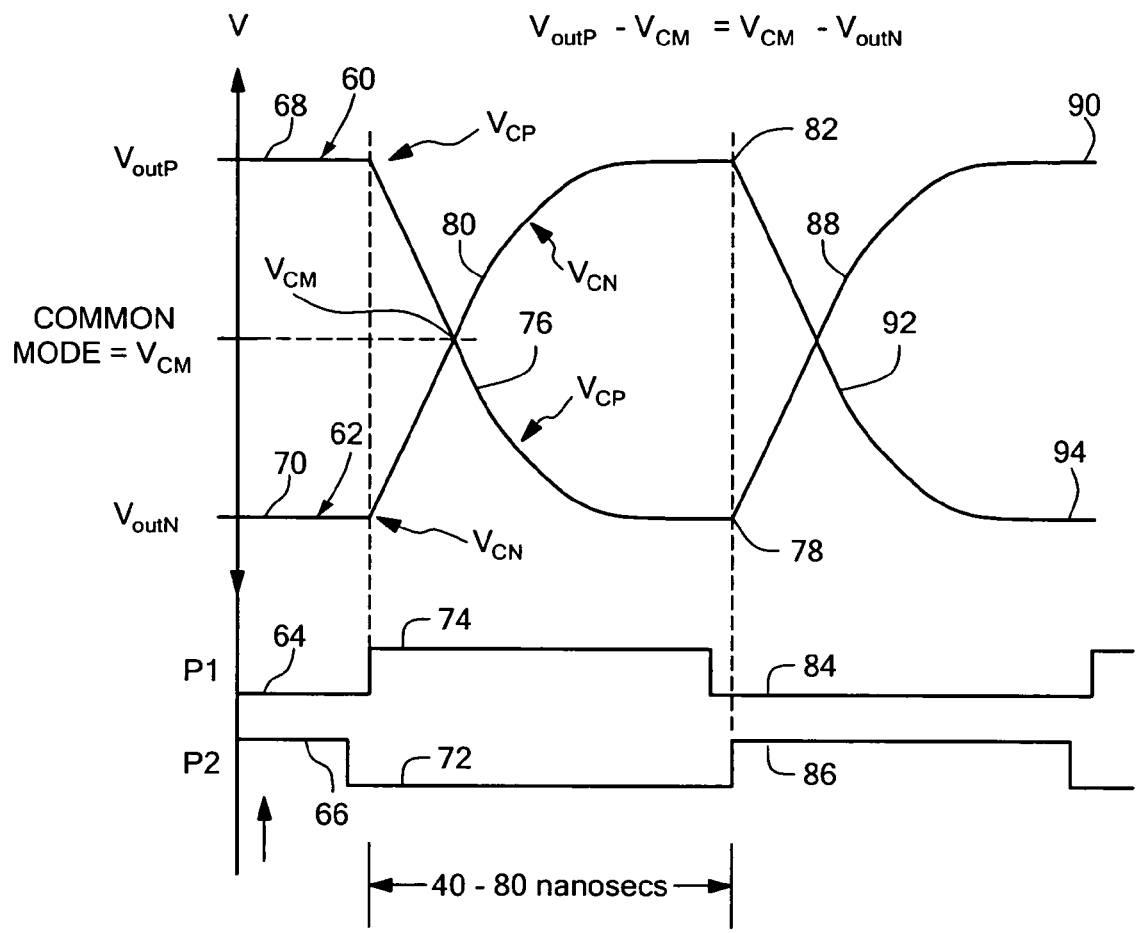
FIG. 3 illustrates idealized waveforms occurring in the circuits of FIGS. 1 and 2.

The operation of system 10a can be better understood with reference to FIG. 3 where the voltage $V_{cp}$ at the input node 25 of capacitor C1, 36a is shown at 60 and the voltage $V_{cn}$ at input node 27 of capacitor C2, 38a is shown at 62. Also shown are the phase signals P1 and P2: when P1 is high, P2 is low, and, conversely, when P2 is high P1 is low. The high and low periods may, for example, be approximately 40 to 80 nanoseconds in some embodiments as indicated in FIG. 3. During phase P2 when P1 is low as at 64 and P2 is high as at 66, $V_{cp}$ is at $V_{outp}$ at 68 and $V_{cn}$ is at $V_{outn}$ as at 70. When the phase changes from phase P2 to phase P1, that is phase P2 goes from high 66 to low 72 and phase P1 goes from low 64 to high 74, the voltage $V_{cp}$ at node 25 of capacitor C1, 36a drops along path 76 until it reaches the low point 78 of $V_{outn}$. Simultaneously, the voltage at node 27 of capacitor C2, 38a begins to rise from $V_{outn}$ along path 80 until it reaches point 82 at $V_{outp}$. When the phase P1 signal goes low at 84 and the phase P2 signal once again goes high at 86, the cycle begins again as $V_{cp}$ rises along path 88 eventually reaching $V_{outp}$ at 90, while $V_{cn}$ descends along path 92 eventually reaching $V_{outn}$ at 94. Viewing the conduct of $V_{cp}$ 60 and $V_{cn}$ 62 it can be seen that during each cycle, or switching between phase P1 and phase P2, the driver circuit 14a, whatever it might be, must re-source or re-sink the respective capacitors across the full voltage range from $V_{outp}$ to $V_{outn}$.

Figure 4:
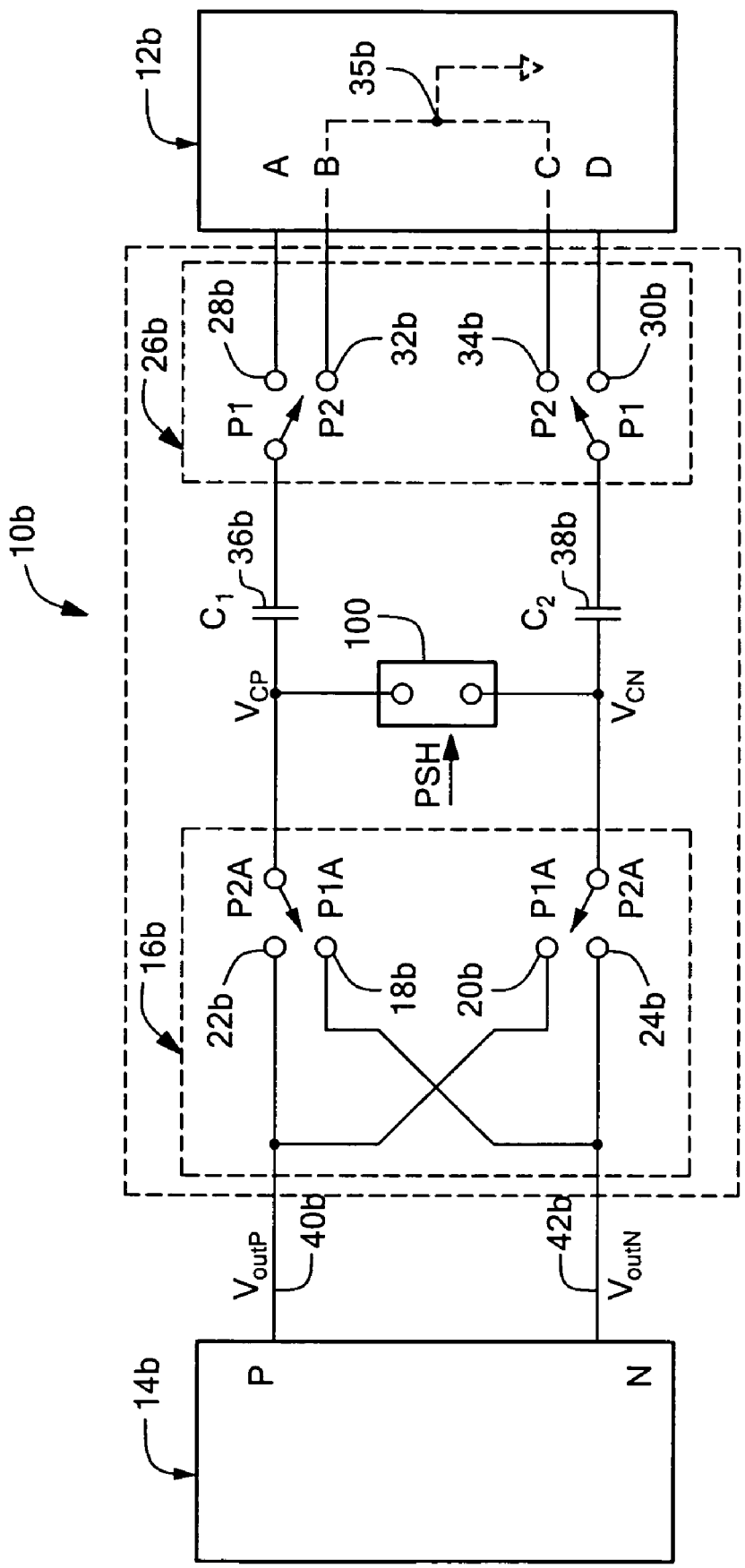
FIG. 4 is a schematic block diagram of a switched capacitor circuit according to the invention.
Figure 5:
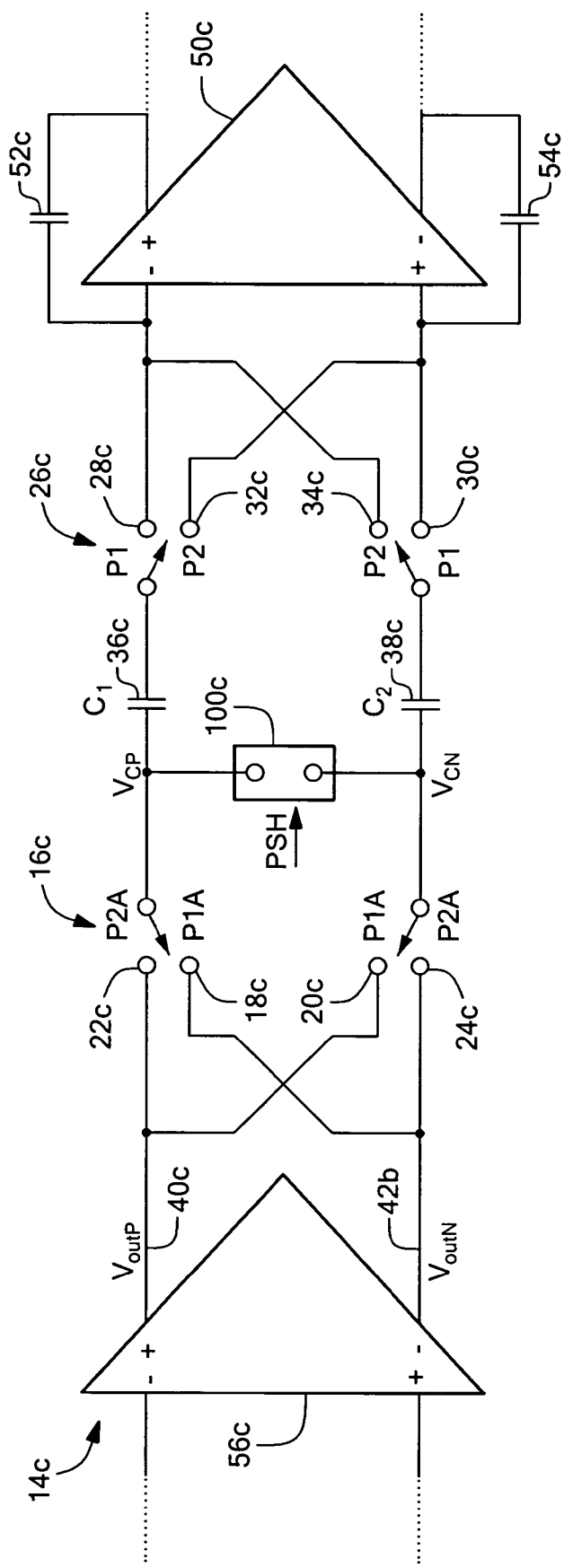
FIG. 5 is a view similar to FIG. 4 in which the driver and charge receiver circuits are implemented as an amplifier driver and integrator charge receiver, respectively.

In accordance with this invention, the sourcing and sinking requirement on driver 14b, FIG. 4, may be roughly halved by providing a brief period or phase at the beginning of phase P1 and phase P2 where capacitors 36b and 38b are enabled to share their charge after the appropriate switches have closed in output switch 26b in each phase but before the appropriate switches in cross coupled input switch 16b are closed in each phase. This is accomplished using shunt phase switching circuit 100. That period during which capacitors 36b and 38b share their charge may be, for example, approximately five to ten percent or so of the period of the phases. So if phase P1 and phase P2 are approximately 80 nanoseconds the sharing or third phase designated as the shunt phase may be 4–8 nanoseconds. To provide for this third shunt phase, output switch 26c, FIG. 5, is operated first in each of phase P1 and phase P2 while cross coupled input switch circuit 16c is operated during an abbreviated phase P1 and phase P2 designated P1A and P2A, whose onsets are delayed a bit with respect to that of the phase P1 and phase P2 signals. During that period between the onset of phase P1 and abbreviated phase P1 and between phase P2 and abbreviated phase P2 the shunt phase PSH occurs. FIGS. 4 and 5 demonstrate that output switch 26c is not necessarily, but may be, a cross-coupled switch similar to the cross-coupled switch 16c.

Figure 6:
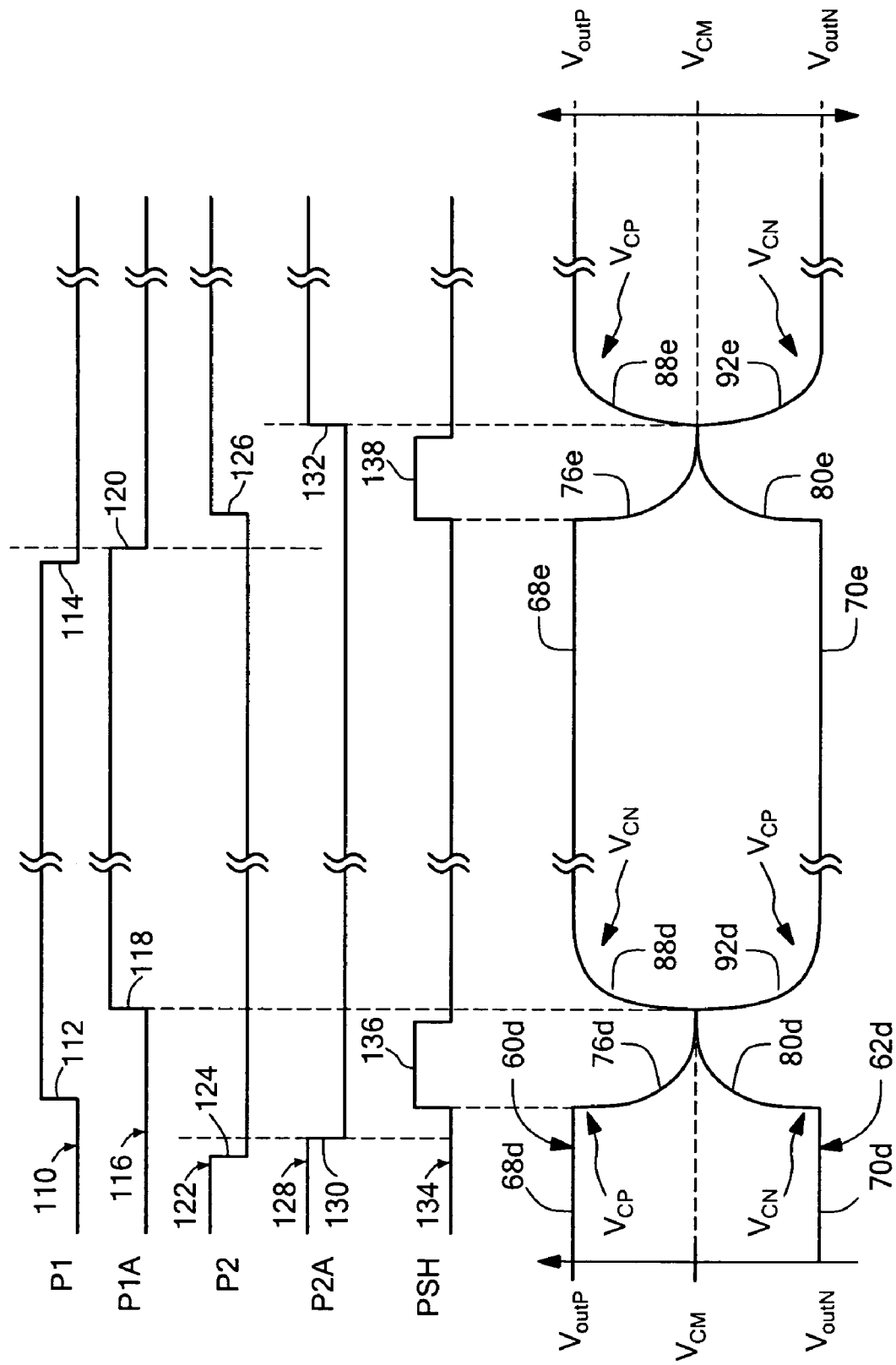
FIG. 6 illustrates idealized waveforms occurring in the circuit of FIGS. 4 and 5.

In FIG. 6, phase P1 110 begins at 112 and ends at 114, while abbreviated phase P1, P1A, 116 begins a short time later at 118 and ends at 120. The phase P2 signal 122 ends at 124 and begins again at 126. The abbreviated phase P2 signal P2A ends at 130 but it begins again at 132 a short time after the beginning of phase P2 at 126. The third phase signal or shunt phase signal PSH, 134 occurs in the period between the onset of phase P1 at 112 and phase P1A at 118 giving rise to shunt phase signal 136 and also between the onset 126 of phase P2, 122 and the onset at 132 of phase P2A signal 128 which results in shunt phase signal 138. Phase P1 shunt phase 136 would likely start just after the occurrence of rising edge 112 and end just before rising edge 118. Phase P2 shunt phase 138 would likely start just after the occurrence of rising edge 126 and end just before the rising edge 132.

Now, it can be seen by following the voltage curves $V_{cp}$ and $V_{cn}$, the voltage on capacitors C1, 36c and C2, 38c in FIG. 5, that, for example, during phase P2 and phase P2A, the capacitors are charged to $V_{outp}$ 68d and $V_{outn}$ 70d, FIG. 6, but then after the end of phase P2 during the shunt phase, capacitors C1, 36c and C2, 38c, FIG. 5, are connected together and share their charge so that they both approach the common voltage $V_{cm}$, FIG. 6. At the end of the phase P1 shunt phase 136 $V_{cn}$ charges up along path 88d to $V_{outp}$ and $V_{cp}$ charges down or discharges along path 92d to $V_{outn}$ but in doing this they only have to charge up and discharge from the common voltage $V_{cm}$ which is approximately half-way between the two ultimate voltages. Thus by sharing the charge, the switched capacitors C1, 36c and C2, 38c are each brought from their extreme levels to the common mode voltage which is roughly in the middle. The driver, then, only has to drive them from that mid-point $V_{cm}$ to the high and low points $V_{outp}$ and $V_{outn}$. The same thing occurs during phase P2 shunt phase when phases P1 and P1A end at 114 and 120 followed by the delayed onset of phase P2A at 132 following onset 126 of phase P2, 122. That delay gives rise to the shunt phase signal 138 which defines the period during which the path 76e and 80e converge on the common mode voltage $V_{cm}$ after which they charge and discharge along path 88e and 92e as before. This description again assumes that $V_{outp} > V_{outn}$. When the reverse is true the polarities and directions would change too.

Figure 7:
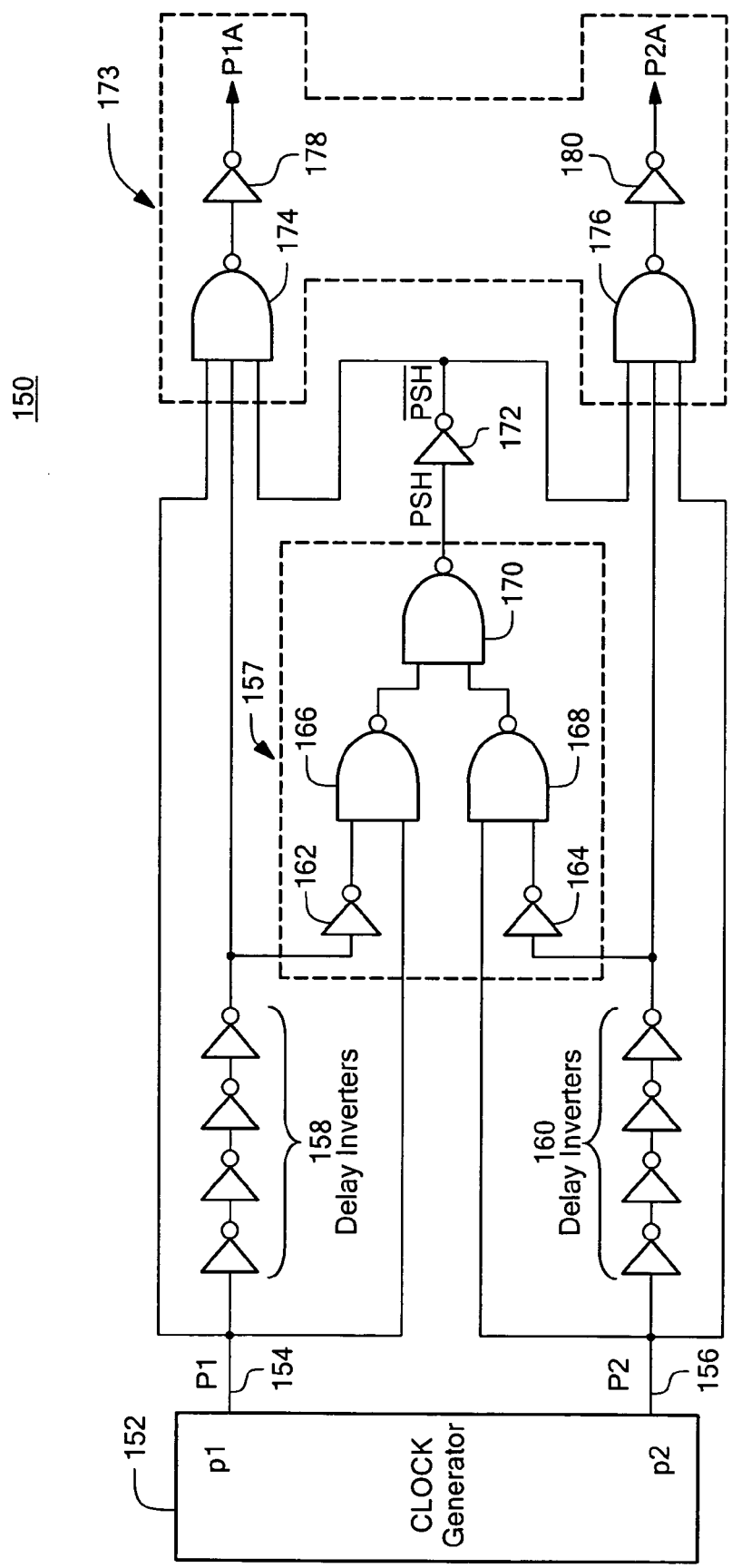
FIG. 7 is a schematic block diagram of one implementation of a clock system for generating the phase signals occurring in FIG. 6.

The phase P1 and phase P2 signals and the phase P1A and phase P2A signals, as well as the shunt phase signal and its complementary signal, PSH and PSH, may be generated in any convenient way. A clock system 150, FIG. 7, for doing so uses a clock circuit 152 to generate phase P1 signal P1 154 and phase P2 signal P2 156. Then shunt phase clock circuit 157 using delay inverters that are typically already available in clock systems for switch capacitor circuits such as delay inverters 158 and 160 coupled with additional inverters 162, 164, nand gates 166, 168 and 170 and a further inverter 172 generates the shunt phase PSH and complementary shunt phase PSH signals. Onset delay clock circuit 173 with nand gates 174, 176 and inverters 178, and 180, generates the phase P1A and phase P2A signals. Thus, with the addition of just a few inverters and nand gates there can be achieved a reduction in the power required and/or an improvement in harmonic distortion.

Figure 8:
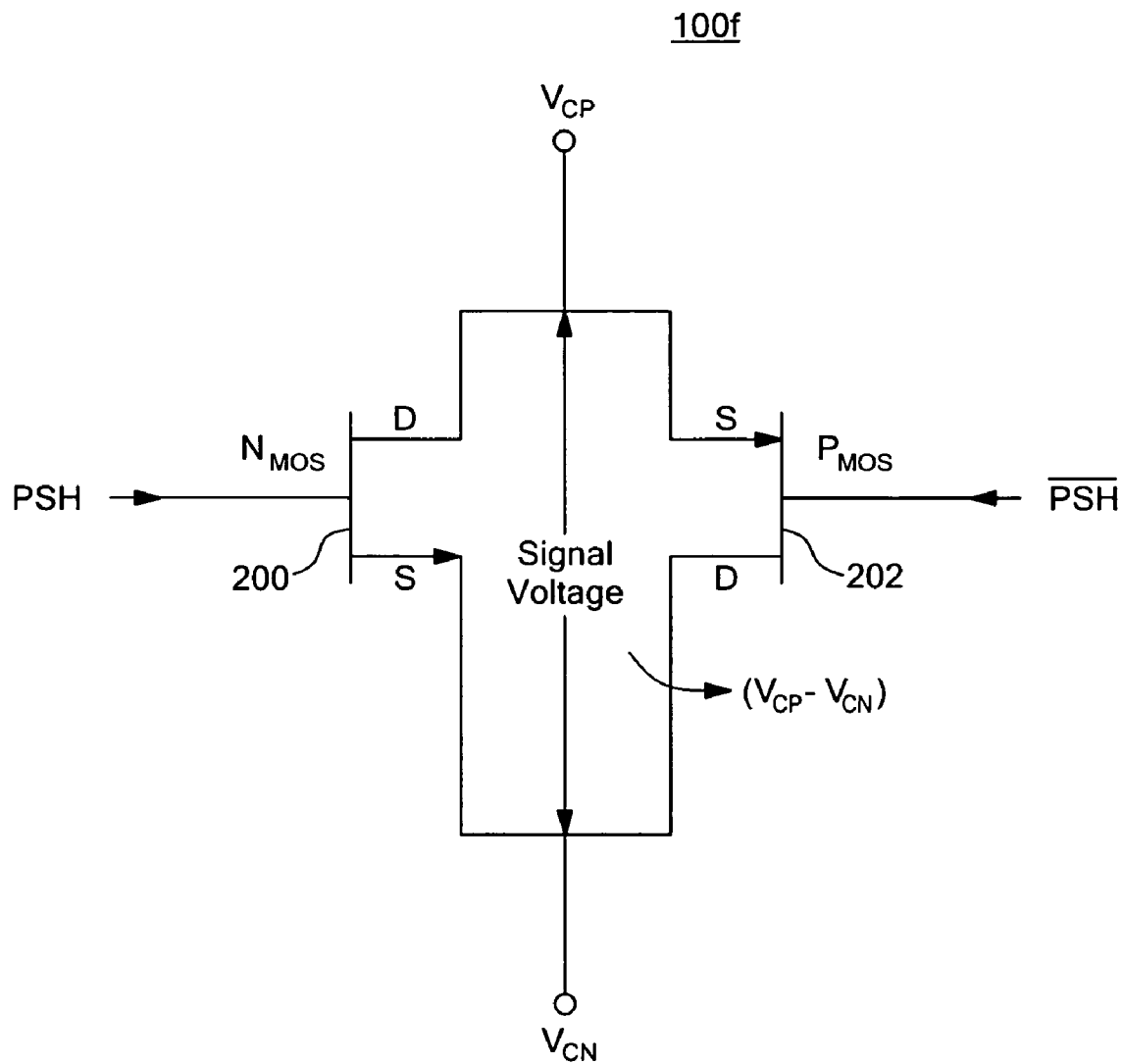
FIG. 8 is a schematic diagram of one embodiment of the phase shunt circuit of FIGS. 4 and 5.
Figure 9:
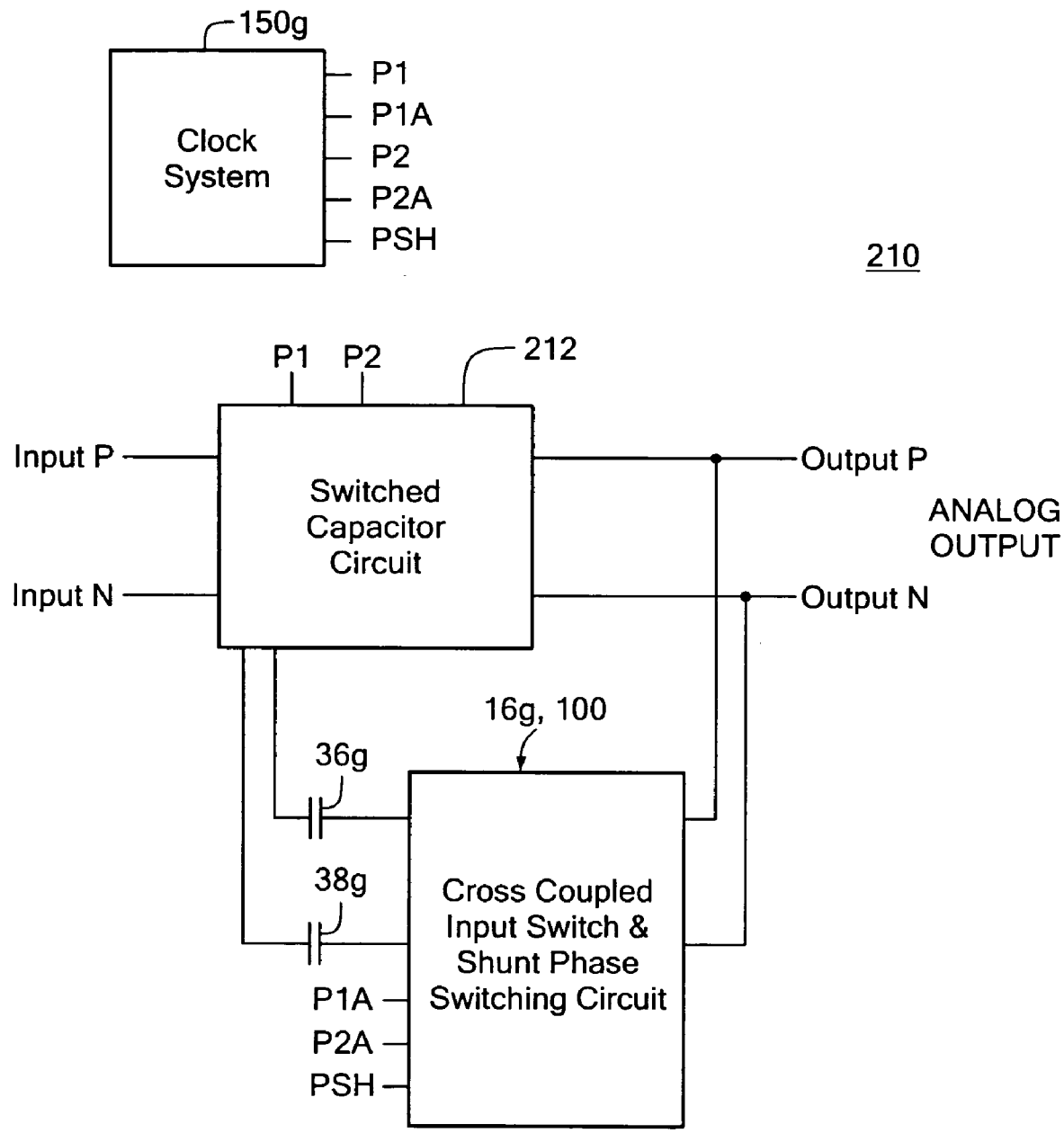
FIG. 9 is a schematic block diagram of another application of the switched capacitor mutual charging system of this invention in a switched capacitor filter.

Any suitable switching circuit can be used for shunt phase switching circuit 100. One preferred implementation is a CMOS pass gate which provides a low impedance path when switched on over a wide range of signal voltages. This is shown in FIG. 8 where CMOS pass gate 100f includes NMOS transistor 200 and PMOS transistor 202. The signal voltage applied across them is $V_{cp} - V_{cn}$. Their actuating signals are the shunt phase signal PSH and the complementary shunt phase signal PSH. CMOS pass gate 100f operates in the usual way: the on-resistance of the PMOS transistor 202 decreasing with increasing drain and source signal voltages while the on-resistance of the NMOS transistor 200 increases with increasing drain and source signal voltages. The switched capacitor mutual charging system according to this invention is not limited to the embodiment shown herein. It may be used in a wide range of applications. For example, it could be used in a switched capacitor filter 210, FIG. 9, where the phase signals are provided by clock system 150g and the switched capacitor mutual charging system 10g is actually included in the feedback loop of a switched capacitor filter 210 including switched capacitors circuit 212 and feedback capacitors 36g and 38g wherein the switched capacitors 36g, 38g, of the switched capacitor mutual charging system 10g actually form a part of the feedback path of the switched capacitor filter 210. It could also be used where driver 14b, in FIG. 4, for example, is an anti-alias filter input to a switched capacitor analog to digital converter (ADC).

In the specific embodiment disclosed here, the switched capacitor mutual charging system includes a cross-coupled switched capacitor circuit including a cross-coupled input switch and an output switch which may or may not be cross-coupled. Also the output switch is shown as having first and second sets of output switches operating during first and second phases and the cross-coupled input switch is shown as having first and second sets of input switches operating during abbreviated first and second phases whose onsets are delayed relative to the first and second phases. There are first and second capacitors connected between the output switch circuit and the cross-coupled input switch circuit. Further there is specifically disclosed a shunt switching circuit for connecting together the capacitors during a shunt phase occurring between the onset of the first phase and the abbreviated first phase and the second phase and the abbreviated second phase for enabling the capacitors to share charge with each other toward a common mode voltage after the onset of the first and second phase but before the onset of the abbreviated first and second phases.

However, the invention is not limited to this. More broadly it covers any manner of phasing or timing or switching where both the output switch circuit and cross-coupled input switch circuit can be selectively operated separately but in each case the operation of cross-coupled input switches occurs after the operation of the output switches and shunt switches so that the capacitors can share charge with each other toward a common mode voltage after the output switches and shunt switches are operated but before the input switches are operated.

Figure 10:
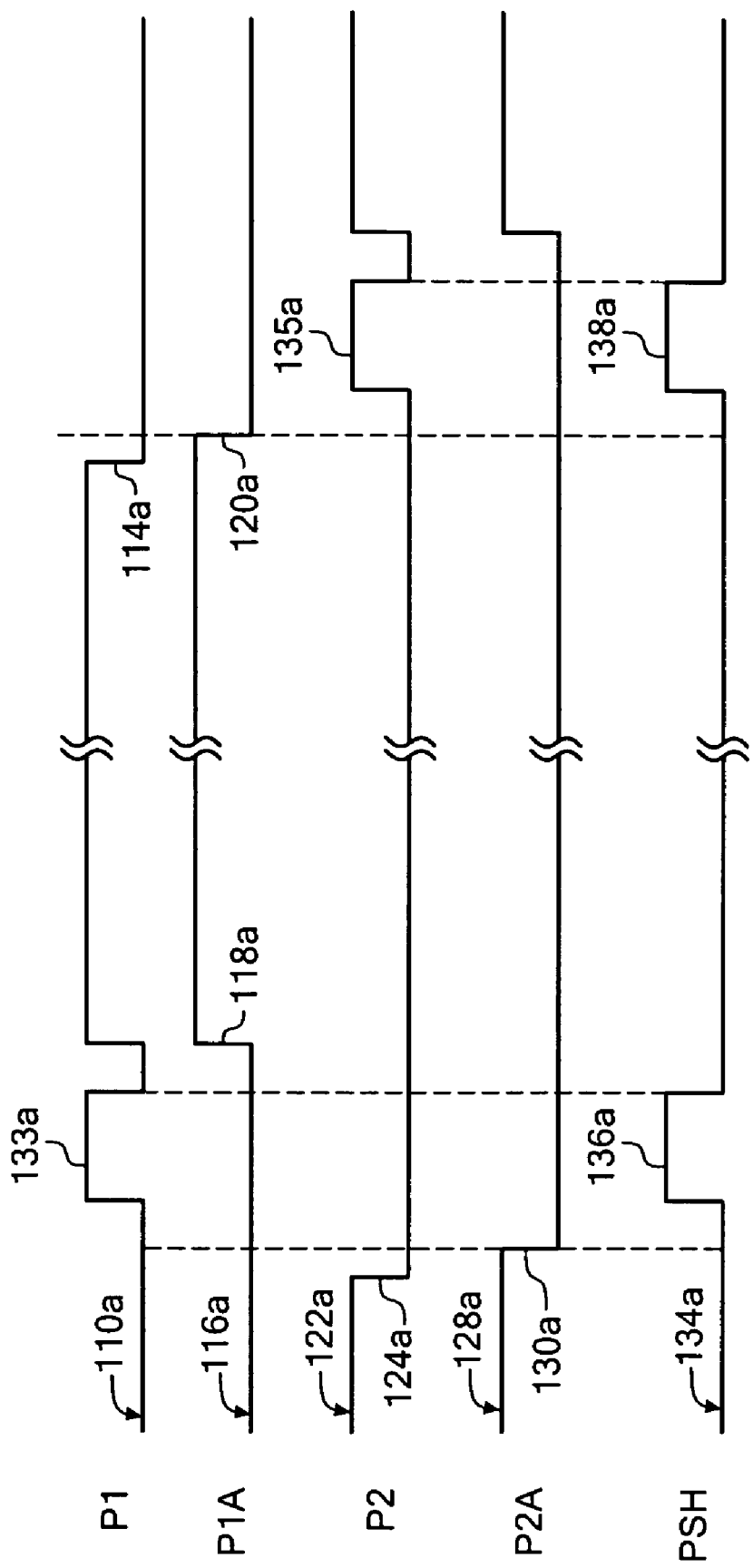
FIG. 10 illustrates idealized waveforms similar to FIG. 6 where the switch control signals have been broken up into more phases.

For example, instead of defining shunt or cross charging phase 136, 138, FIG. 6, as occurring between the beginning 112 of P1, 110 and the beginning 118 of P1A, 116, and the beginning 126 of P2 and beginning 132 of P2A, there can be discrete times or signals to define the shunting or mutual charging operation. That is, a first time period or signal 133a, FIG. 10, can define shunt period 136a, and another signal 135a can define shunt period 138a. In this environment, one could denominate four phases, for example, phase 1, phase 2, phase 3 and phase 4 as shown in FIG. 10, and yet still be within the scope of this invention.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A switched capacitor mutual charging system comprising:
    a cross-coupled switched capacitor circuit including a cross-coupled input switch circuit and an output switch circuit;
    said output switch circuit having first and second sets of output switches selectively operated during separate phases; said cross-coupled input switch circuit including first and second sets of input switches also selectively operated during separate phases but delayed relative to that of the output switches;
    first and second capacitors connected between said output switch circuit and said cross-coupled input switch circuit; and
    a shunt phase switching circuit for connecting together said capacitors after said output switches are operated but before the input switches are operated for enabling said capacitors to share charge with each other toward a common mode voltage after the output switches are operated but before the input switches are operated.

2. The switched capacitor mutual charging system of claim 1 in which said shunt switching circuit includes a MOS pass gate.

3. The switched capacitor mutual charging system of claim 1 further including a clock system for generating said separate phases.

4. The switched capacitor mutual charging system of claim 1 in which the output switches are cross-coupled.

5. The switched capacitor mutual charging system of claim 1 in which at least one of said sets of output switches is connected to a common point.

6. The switched capacitor mutual charging system of claim 1 in which said shunt switching circuit is between said capacitors and said cross-coupled input switch circuit.

7. A method of mutual charging switched capacitors in a switched capacitor system, the method comprising:
    operating first and second sets of output switches during separate phases;
    operating first and second sets of input switches during said separate phases but after said output switches are operated; and
    connecting the switched capacitors together after the output switches are operated but before the input switches are operated to enable them to share charge with each other toward a common mode voltage after said output switches are operated but before the input switches are operated.

8. A switched capacitor mutual charging system comprising:
    a cross-coupled switched capacitor circuit including a cross-coupled input switch circuit and an output switch circuit;
    said output switch circuit having first and second sets of output switches operating during first and second phases; said cross-coupled input switch circuit including first and second sets of input switches operated during abbreviated first and second phases whose onsets are delayed relative to that of said first and second phases.
    first and second capacitors connected between said output switch circuit and said cross-coupled input switch circuit;
    a shunt switching circuit for connecting together said capacitors during a shunt phase occurring between the onset of said first phase and said abbreviated first phase and said second phase and said abbreviated second phase for enabling said capacitors to share charge with each other toward a common mode voltage after the onset of said first and second phase but before the onset of said abbreviated first and second phases.

9. The switched capacitor mutual charging system of claim 8 in which said shunt switching circuit includes a pass gate.

10. The switched capacitor mutual charging system of claim 8 further including a clock system for generating said first, second and shunt phases.

11. The switched capacitor mutual charging system of claim 10 in which said clock system includes a clock circuit for generating said first and second phases, an onset delay clock circuit responsive to said clock circuit for generating said abbreviated first and second phases and a shunt phase clock circuit for generating said shunt phase between the onsets of said first and second phases and said abbreviated first and second phases.

12. The switched capacitor mutual charging system of claim 8 in which at least one of said sets of output switches is connected to a common point.

13. The switched capacitor mutual charging system of claim 8 in which said shunt switching circuit is between said capacitors and said cross-coupled input switch circuit.

14. The switched capacitor mutual charging system of claim 8 in which said sets of output switches are cross-coupled.

15. A method of mutual charging switched capacitors in a switched capacitor system, the method comprising:

operating first and second sets of output switches during first and second phases;

operating first and second sets of input switches during abbreviated first and second phases; and connecting the switched capacitors together during a shunt phase between the onset of said first phase and abbreviated first phase and said second phase and abbreviated second phase to share charge with each other toward a common mode voltage after the onset of said first and second phases but before the onset of said abbreviated first and second phases.

\* \* \* \* \*